(12) United States Patent
Chen et al.

(10) Patent No.: US 12,150,241 B2
(45) Date of Patent: Nov. 19, 2024

(54) ANTENNA IMPEDANCE MATCHING CIRCUIT, ANTENNA SYSTEM AND MOBILE TERMINAL

(71) Applicant: HuiZhou TCL Mobile Communication Co., Ltd., Guangdong (CN)

(72) Inventors: Wei Chen, Guangdong (CN); Junsheng Hou, Guangdong (CN); Song Bai, Guangdong (CN)

(73) Assignee: HuiZhou TCL Mobile Communication Co., Ltd., HuiZhou (CN)

( * ) Notice: Subject to any disclaimer, the term of this patent is extended or adjusted under 35 U.S.C. 154(b) by 456 days.

(21) Appl. No.: 17/615,843

(22) PCT Filed: Dec. 18, 2019

(86) PCT No.: PCT/CN2019/126177
§ 371 (c)(1),
(2) Date: Dec. 2, 2021

(87) PCT Pub. No.: WO2021/109248
PCT Pub. Date: Jun. 10, 2021

(65) Prior Publication Data
US 2022/0336960 A1   Oct. 20, 2022

(30) Foreign Application Priority Data

Dec. 3, 2019   (CN) .......................... 201911222771.4

(51) Int. Cl.
*H01Q 5/50*   (2015.01)
*H01P 5/16*   (2006.01)
(Continued)

(52) U.S. Cl.
CPC .............. *H05K 1/025* (2013.01); *H01P 5/16* (2013.01); *H01Q 5/50* (2015.01); *H03H 7/38* (2013.01); *H04B 1/18* (2013.01)

(58) Field of Classification Search
CPC . H03H 7/38; H01Q 5/50; H01Q 5/335; H04B 1/18; H01P 1/203; H05K 1/025
See application file for complete search history.

(56) References Cited

U.S. PATENT DOCUMENTS 4,275,366 A * 6/1981 Schwarzmann ........ H01P 1/185
333/156
4,491,809 A * 1/1985 Noda ...................... H03F 3/601
330/277

(Continued)

FOREIGN PATENT DOCUMENTS

| CN | 204407515 | 6/2015 |
| CN | 107483073 | 12/2017 |
| CN | 107612572 | 1/2018 |

OTHER PUBLICATIONS

Notification of Office Action and Search Report Dated Jul. 13, 2020 From the State Intellectual Property Office of the People's Republic of China Re. Application No. 201911222771.4 and its Translation of the Office Action into English. (7 Pages).

(Continued)

*Primary Examiner* — Stephen E. Jones

(57) ABSTRACT

Disclosed is an antenna impedance matching circuit, an antenna system, a printed circuit board, and a terminal. The antenna impedance matching circuit comprises: a first transmission line having a first specific length such that the first transmission line is capacitive, and a second transmission line having a second specific length such that the second transmission line is inductive. In particular, the first transmission line and the second transmission line are connected (Continued)

in parallel, and terminals of the first transmission line and the second transmission line are open or shorted.

19 Claims, 8 Drawing Sheets

(51) Int. Cl.
    *H03H 7/38*     (2006.01)
    *H04B 1/18*     (2006.01)
    *H05K 1/02*     (2006.01)

(56) References Cited

U.S. PATENT DOCUMENTS

| | | |
|---|---|---|
| 4,999,596 A * | 3/1991 | Nakatani ............... H01P 1/2039 333/204 |
| 2015/0116179 A1 | 4/2015 | Mikata |
| 2015/0147980 A1 | 5/2015 | Larsen et al. |
| 2015/0180132 A1 | 6/2015 | Lahti |
| 2017/0214378 A1 | 7/2017 | Black et al. |

OTHER PUBLICATIONS

International Search Report and the Written Opinion Dated Jul. 27, 2020 From the International Searching Authority Re. Application No. PCT/CN2019/126177. (7 Pages).

\* cited by examiner

ANTENNA IMPEDANCE MATCHING CIRCUIT, ANTENNA SYSTEM AND MOBILE TERMINAL

RELATED APPLICATIONS

This application is a National Phase of PCT Patent Application No. PCT/CN2019/126177 having International filing date of Dec. 18, 2019, which claims the benefit of priority of Chinese Patent Application No. 201911222771.4 filed on Dec. 3, 2019. The contents of the above applications are all incorporated by reference as if fully set forth herein in their entirety.

FIELD AND BACKGROUND OF THE INVENTION

Field of Invention

The present invention relates to the field of communications technology, in particular, to an antenna impedance matching circuit, an antenna system, a printed circuit board, and a mobile terminal.

Description of Prior Art

An antenna is an important radio device for transmitting and receiving electromagnetic waves. The radio transmitter outputs power for radio frequency (RF) signals, which are sent through a feeder line (cable) to the antenna, and radiated by the antenna in the form of electromagnetic waves. The electromagnetic waves after reaching a receiving location, are received by an antenna and sent through a feeder line to a radio receiver.

Connection between an antenna and its feeder line is called an input terminal or a feed point of the antenna. A ratio of voltage and current at the input terminal of the antenna is called input impedance of the antenna. The main purpose of studying the antenna impedance is to realize the matching between the antenna and the feeder line. When the antenna and the feeder line match, power transmission from the transmitter to the antenna or from the antenna to the receiver is maximized, reflected waves do not occurs in the feeder line, and reflection coefficient is equal to zero. For the transmitting antenna, if the matching is not processed well, the radiant power of the antenna will be reduced, loss in the feeder line will increase, and power capacity of the feeder line will also be reduced. In serious cases, transmitter frequency "traction" phenomenon occurs, namely oscillation frequency changes.

In practical radio applications, to connect a complex load, such as an antenna, to a purely resistive source, the most common scenario is to construct a matching network between the load and the source. To match the transmitting antenna to the feeder line, input impedance of the antenna should be equal to characteristic impedance of the feeder line.

The antenna matching position in conventional designs is adjusted with capacitors and inductors, as shown in FIG. 1, to approximate overall antenna load to characteristic impedance of 50 ohm of a transmission line, thus to minimize signal loss on transmission and improve antenna efficiency. However, capacitors and inductors typically also introduce a certain amount of loss that causes loss of a part of transmitted signals and reduce antenna system efficiency, known as a ratio of the total power radiated into space to the total power at an input port.

SUMMARY OF THE INVENTION

Technical Problems

The present application provides an antenna impedance matching circuit, an antenna system, a printed circuit board, and a mobile terminal to address signal loss problems caused by antenna impedance matching circuits in the current technology.

Technical Solutions

To address the problem, an embodiment of the application provides an antenna impedance matching circuit comprising:
  a first transmission line, wherein the first transmission line having a first specific length that makes the first transmission line capacitive; and
  a second transmission line, wherein the second transmission line having a second specific length that makes the second transmission line inductive;
  wherein the first transmission line and the second transmission line are connected in parallel and wherein terminals of the first transmission line and the second transmission line are open or shorted.

In particular, both the first transmission line and the second transmission line may have a width of 0.2-0.3 mm.

In particular, impedance of the first transmission line and the second transmission line may be both 50 ohms.

To address the problem, an embodiment of the application provides an antenna system comprising an antenna and an antenna impedance matching circuit, wherein the antenna impedance matching circuit comprises:
  a first transmission line having a first specific length that makes the first transmission line capacitive; and
  a second transmission line having a second specific length that makes the second transmission line inductive;
  wherein the first transmission line and the second transmission line are connected in parallel, and terminals of the first transmission line and the second transmission line are open or shorted.

In particular, both the first transmission line and the second transmission line may have a width of 0.2-0.3 mm.

In particular, impedance of the first transmission line and the second transmission line may be both 50 ohms.

To address the problem, an embodiment of the application provides an printed circuit board for an antenna system, wherein the antenna system comprises an antenna and antenna impedance matching circuit, the antenna impedance matching circuit comprising: a first transmission line having a first specific length that makes the first transmission line capacitive, and a second transmission line having a second specific length that makes the second transmission line inductive, wherein the first transmission line and the second transmission line are connected in parallel, and terminals of the first and second transmission lines are open or short-circuited. The printed circuit board comprises:
  a first line connected in parallel with a line containing an antenna feeder line, to hold the transmission line having the first specific length;
  a second line connected in parallel with the line containing the antenna feeder line, to hold the transmission line having the second specific length;
  wherein the first line and the second line are each in parallel with the line containing the feeder line, a terminal of the first line is configured to enclose the first transmission line to unground the first transmission line, or is configured to be open to ground the first transmission line; and a terminal of the second line is configured to enclose the second transmission line to unground the second transmission line, or is configured to open to ground the second transmission line.

In particular, a second layer of the printed circuit board may be partially clear below the first line and the second line.

In particular, the first line and the second line may be at a distance of 0.1-0.2 mm from a ground.

In particular, a distance between the first and second lines and a location of an antenna latch on the printed circuit board may be less than 5 mm.

To address the problem, an embodiment of the application provides a circuit board comprising a printed circuit board and an antenna impedance matching circuit, wherein the antenna impedance matching circuit is mounted on the printed circuit board, the printed circuit board is applied to an antenna system comprising an antenna and the antenna impedance matching circuit;

wherein the antenna impedance matching circuit comprises: a first transmission line having a first specific length that makes the first transmission line capacitive, and a second transmission line having a second specific length that makes the second transmission line inductive, wherein the first transmission line and the second transmission line are connected in parallel, and terminals of the first transmission line and the second transmission line are open or shorted;

the printed circuit board comprises: a first line connected in parallel with a line containing an antenna feeder line, for holding a transmission line having the first specific length, and a second line connected in parallel with the line containing the antenna feeder line, for holding a transmission line having the second specific length;

wherein a terminal of the first line is configured to enclose the terminal of the first transmission line to unground the first transmission line, or is configured to be open to ground the first transmission line, and a terminal of the second line is configured to enclose the terminal of the second transmission line to unground the second transmission line, or is configured to be open to ground the second transmission line.

In particular, a second layer of the printed circuit board may be partially clear below the first line and the second line.

In particular, the first line and the second line may be at a distance of 0.1-0.2 mm from a ground.

In particular, a distance between the first and second lines and a location of an antenna latch on the printed circuit board may be less than 5 mm.

In particular, both the first transmission line and the second transmission line may have a width of 0.2-0.3 mm.

In particular, impedance of the first transmission line and the second transmission line may be both 50 ohms.

To address the problem, an embodiment of the application provides an antenna system comprising an antenna and a circuit board, wherein the circuit board comprises a printed circuit board and an antenna impedance matching circuit, the antenna impedance matching circuit is mounted on the printed circuit board;

wherein the antenna impedance matching circuit comprises: a first transmission line having a first specific length that makes the first transmission line capacitive, and a second transmission line having a second specific length that makes the second transmission line inductive, wherein the first transmission line and the second transmission line are connected in parallel, and terminals of the first transmission line and the second transmission line are open or shorted;

the printed circuit board comprises: a first line connected in parallel with a line containing an antenna feeder line, for holding a transmission line having the first specific length, and a second line connected in parallel with the line containing the antenna feeder line, for holding a transmission line having the second specific length;

wherein an terminal of the first line is configured to enclose the terminal of the first transmission line to unground the first transmission line, or is configured to be open to ground the first transmission line, and the terminal of the second line is configured to enclose the terminal of the second transmission line to unground the second transmission line, or is configured to be open to ground the second transmission line.

In particular, both the first transmission line and the second transmission line may have a width of 0.2-0.3 mm.

To address the problem, an embodiment of the application provides a mobile terminal comprising an antenna system, wherein the antenna system comprises an antenna and a circuit board, the circuit board comprises a printed circuit board and an antenna impedance matching circuit, the antenna impedance matching circuit is mounted on the printed circuit board;

wherein the antenna impedance matching circuit comprises: a first transmission line having a first specific length that makes the first transmission line capacitive, and a second transmission line having a second specific length that makes the second transmission line inductive, wherein the first transmission line and the second transmission line are connected in parallel, and terminals of the first transmission line and the second transmission line are open or shorted;

the printed circuit board comprises: a first line connected in parallel with a line containing an antenna feeder line, for holding a transmission line having the first specific length, and a second line connected in parallel with the line containing the antenna feeder line, for holding a transmission line having the second specific length;

wherein a terminal of the first line is configured to enclose the terminal of the first transmission line to unground the first transmission line, or is configured to be open to ground the first transmission line, and a terminal of the second line is configured to enclose the terminal of the second transmission line to unground the second transmission line, or is configured to be open to ground the second transmission line.

In particular, the mobile device may comprise one of the following: a mobile phone, a tablet, a laptop, a smart watch, a smart bracelet, or a smart wearable device.

Useful Effects

The beneficial effect of the present application is that, in contrast to the prior art, the present application provides an antenna impedance matching circuit, which reduces signal loss due to the antenna impedance matching circuit and improves antenna efficiency.

BRIEF DESCRIPTION OF THE SEVERAL VIEWS OF THE DRAWINGS

To clear disclose the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

Components in the drawings are not drawn to scale, but only to illustrate the principles of the present application. To facilitate illustration and description of some parts of the present application, the corresponding parts in the drawings may be enlarged, that is, made larger in relation to other parts in the exemplary apparatus actually manufactured in accordance with the present application. In the drawings, the same or similar technical features or parts are to be indicated using the same or similar drawings markings.

DESCRIPTION OF SPECIFIC EMBODIMENTS OF THE INVENTION

Figure 1:
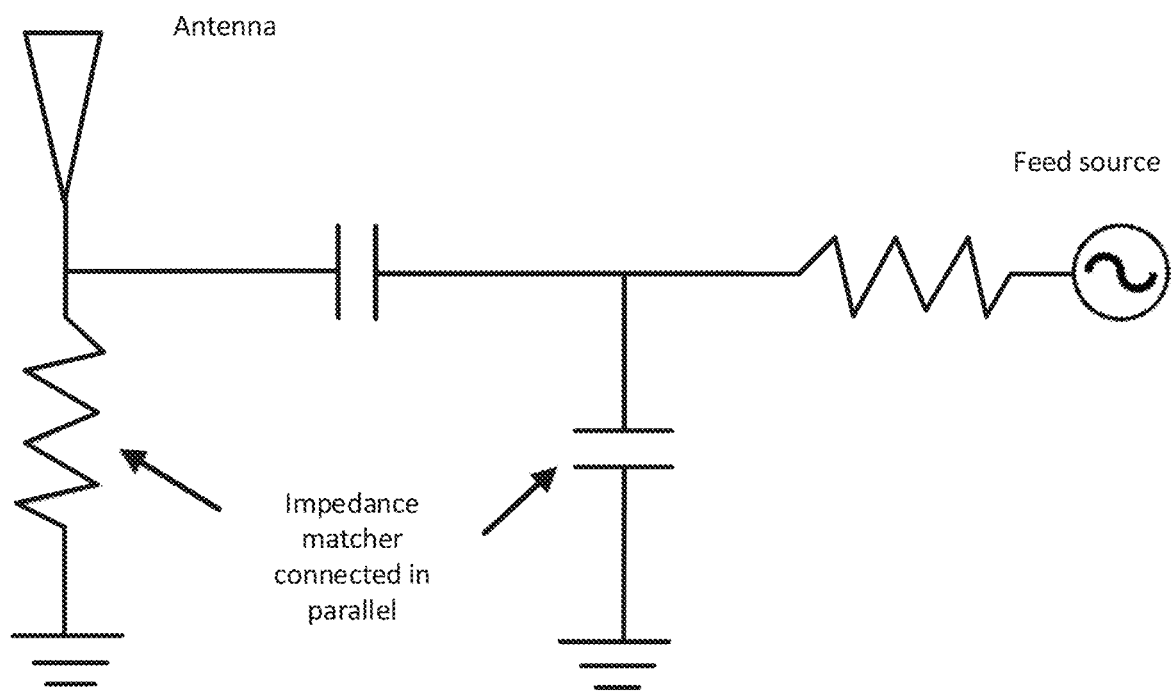
FIG. 1 illustrates a schematic diagram showing a structure of an antenna impedance matching circuit of current technologies.

The following is a clear and comprehensive description of the technical solutions in the embodiments of this application with reference to the drawings in the embodiments of the application. Obviously, the described embodiments are only some, but not all, of the embodiments of this application. Based on the embodiments of the application, other embodiments which may be easily obtained by those having ordinary skills in the art without paying additional creative effort fall within the claims of the application.

In the description of the application, it is to be understood that directions or position relationships indicated by terms "center", "longitudinal", "transverse", "length", "width". "thickness", "top", "bottom", "front", "back", "left", "right", "vertical", "horizontal", "top", "bottom", "inside", "outside", "clockwise", "counterclockwise", and the similar are based on orientation or positional relationship shown in the drawings, intended only to facilitate description of the application and simplify the description, and not intended to indicate or imply that the device or component referred to must have a particular orientation, or be constructed or operated in a particular orientation, and are therefore not to be construed as limitations on the application. Moreover, the terms "first" and "second" are used for descriptive purposes only and are not to be understood as indicating or implying relative importance or the number of technical features indicated. Thus, a feature that is denoted by "first" or "second" may expressly or implicitly include one or more of the same features. In the description of the application, "more than one" means two or more, unless otherwise expressly and specifically indicated.

In this application, the word "example" is used to represent giving an example, an illustration, or a description. Any embodiment described as "example" in this application should not be explained as being more preferred or having more advantages than another embodiment. To enable any person skilled in the art to implement and use the present invention, the following description is provided. Details are listed in the following description for explanation. It should be understood that a person of ordinary skill in the art may learn that the present invention can be implemented without using these specific details. In another instance, a well-known structure and a well-known process are not described in detail, to avoid obscure description of the present invention caused by unnecessary details. Therefore, the present invention is not limited to the shown embodiments, but is consistent with a maximum scope of principles and features that are disclosed in this application.

As mentioned above, the main purpose of researching antenna impedance is to achieve a match between an antenna and a feeder line. When the antenna is matched to the feeder line, the power transmitted from the transmitter to the antenna or from the antenna to the receiver is maximized. To match the transmitting antenna to the feeder line, the input impedance of the antenna should be equal to the characteristic impedance of the feeder line. The following describes an antenna impedance matching circuit constructed according to embodiments of the present application.

First Embodiment

Figure 2:
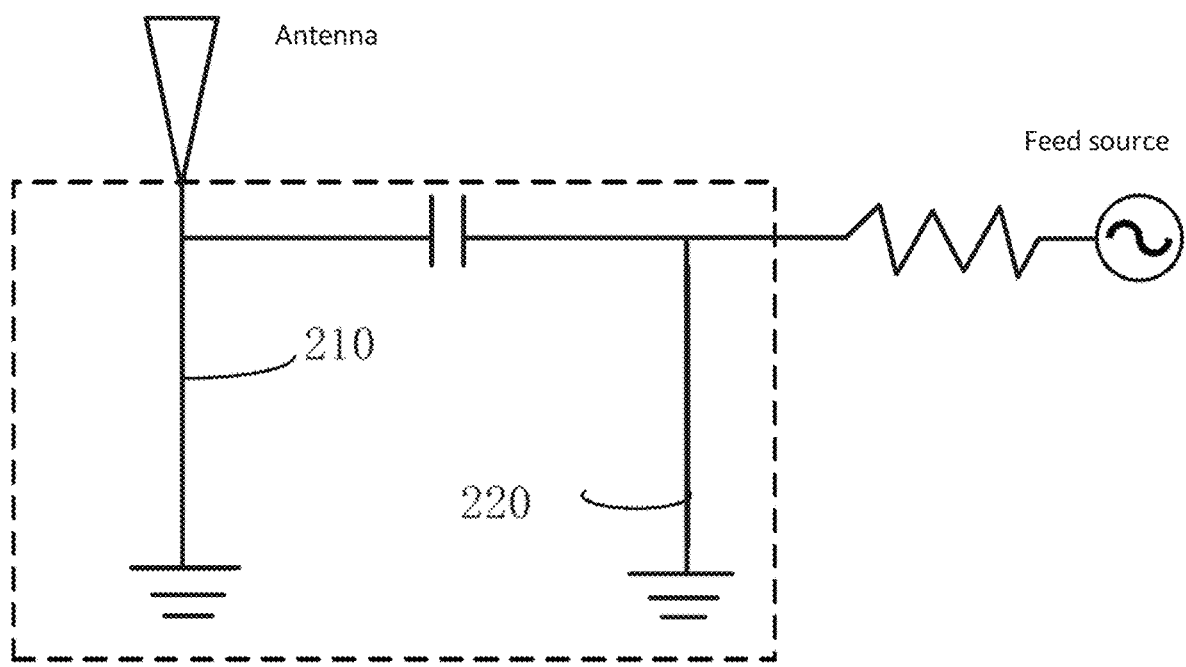
FIG. 2 is a schematic block diagram of an antenna impedance matching circuit according to a first embodiment of the present application.

According to a first embodiment of this application, an antenna impedance matching circuit is provided. FIG. 2 illustrates a schematic block diagram of the antenna impedance matching circuit. As shown in a dashed portion of FIG. 2, the antenna impedance matching circuit comprises: a first transmission line 210. A terminal of the first transmission line 210 may be open or short-circuited, which is shown exemplarily in FIG. 2 as a short-circuited condition and should not be construed as a limitation of the present application. The first transmission line 210 has a first specific length, where the first specific length makes the first transmission line 210 capacitive in lieu of a chip capacitor of a conventional impedance matching circuit. The antenna impedance matching circuit also includes a second transmission line 220. As shown exemplarily in FIG. 2, a terminal of second transmission line 220 is open or shorted. The second transmission line 220 has a second specific length, where the second specific length makes the second transmission line 220 inductive in lieu of a chip inductor of the conventional impedance-matching circuit.

The first specific length and the second specific length mentioned above may be the same or different, depending on application scenarios of the first transmission line 210 and the second transmission line 220, including wavelengths of transmitted signals, impedance of the transmission lines, and desired capacitance and inductance values. For example, if the first transmission line 210 operates at 3 Ghz with an open terminal, has an impedance of 50 ohms to form a capacitance of 2 picofarad (pf), the required length of the transmission line is 13.24 millimeter (mm). A person with ordinary skills in the art may design other length values based on an understanding of embodiments of the present application, and the present application is not limited herein.

As shown in FIG. 2, a capacitive element is connected between a feed source and the antenna, which is not required but is used to demonstrate a usual matching model and is not a component of the antenna matching circuit.

In the above design, because transmission lines, the components of the antenna impedance matching circuit, and the feeder lines are similar transmission lines, and has same impedance characteristics and signal transmission characteristics, the antenna impedance matching circuit so arranged can reduce the loss and further improve the antenna radiation efficiency compared with traditional forms of chip capacitors or inductors.

Figure 3:
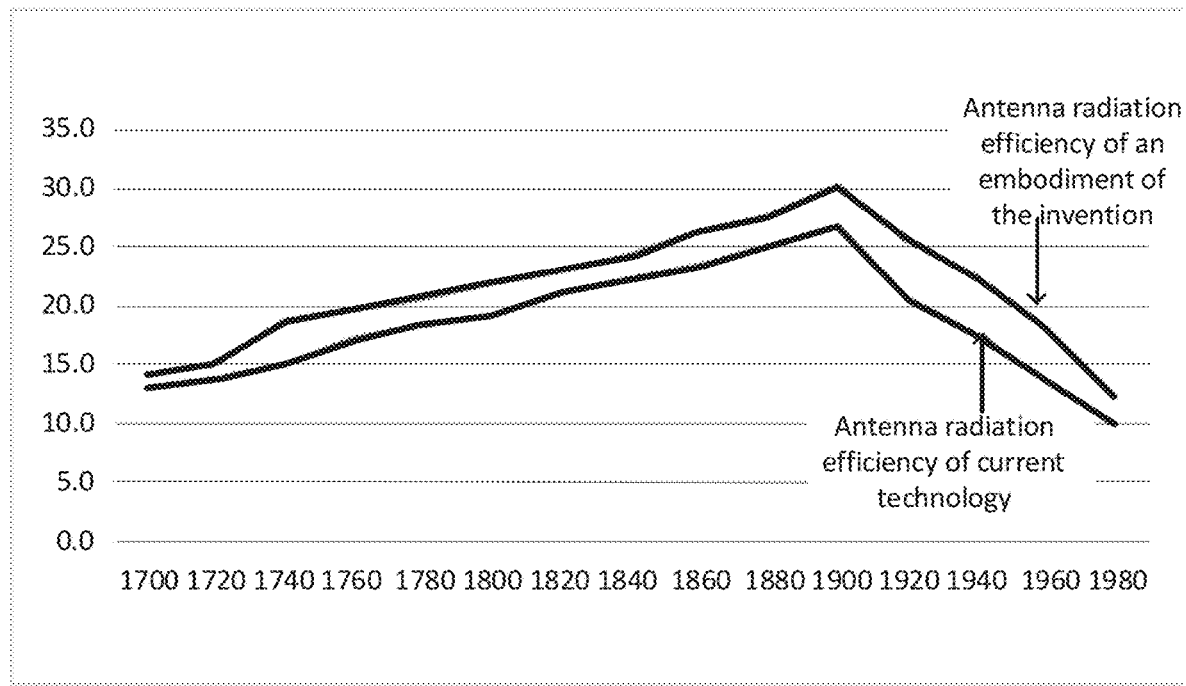
FIG. 3 is a schematic graph showing antenna radiation efficiency improved by the antenna impedance matching circuit according to the first embodiment of the present application.

FIG. 3 shows a curve chart showing antenna radiation efficiency. As shown in FIG. 3, a lower curve shows an antenna radiation efficiency curve obtained by a conventional antenna impedance matching circuit used in current technologies, and an upper curve shows antenna radiation efficiency obtained by an antenna impedance matching circuit according to the first embodiment of the present application. A horizontal axis indicates the frequency and a vertical axis indicates the radiation efficiency of the antenna. As shown in FIG. 3, at any frequency, the antenna radiation efficiency obtained from an embodiment of the application method is higher than that of the current technologies.

To obtain a performance closer to the feeder line and thus to further improve antenna radiation efficiency, the width of the first transmission line 210 and the second transmission line 220 may be kept the same with the feeder line. For example, in a scenario of a mobile phone antenna, the width of the first transmission line 210 and the second transmission line 220 may be 0.2-0.3 mm, or specifically, 0.3 mm. This value is not intended to limit the present application, but may be chosen alternatively by those skilled in the art, depending on actual applications.

A specific example is mentioned above: the first transmission line 210 with an open terminal operates at 3 Ghz with an impedance of 50 ohms to form a 2 pf capacitance, a required length of transmission line is 13.24 mm. Actually, the impedance values of the first transmission line 210 and second transmission line 220 should be chosen to match the feeder line. When the impedance of a load connected to a feeder line terminal is equal to characteristic impedance of the feeder line, the feeder line terminal is a matched connection. When the impedance of the feeder line is 50 ohms, and the antenna impedance is also 50 ohms, the impedances with the feeder line are matched. When the antenna impedance is, for example, 80 ohms, then the impedances with the feeder line are not matched.

In the field of mobile phone communication, the feeder lines generally use an impedance value of 50 ohms. In this case, the impedance of both the first transmission line 210 and the second transmission line 220 can be 50 ohms. This is to match the 50 ohm feeder line. With matched impedance, only incident wave to a terminal load is present on the feeder line, and no reflected wave generated by the terminal load, so that matching ensures that the antenna obtains full signal power when the antenna is used as the terminal load.

As described previously, the impedance that can be adopted for the first transmission line 210 and the second transmission line 220 can be a feeder line of 50-ohm, for example, as commonly used in the field of cell phone communications. In the case where the impedance of the feeder line is other values such as 75 ohms, a transmission line of the antenna impedance matching circuit can be similarly configured to have a matched impedance value. It is to be understood that these values are intended to be used as examples only, to facilitate understanding of the technical scheme of the embodiments of this application, and are not intended to limit the scope of this application.

An embodiment of the present application further provides an antenna system comprising an antenna, and an antenna impedance matching circuit as described above. The antenna may comprise at least one of the following: a patch antenna element, a dipole antenna element, a ceramic resonator, a stamped metal antenna, and a laser direct-formed antenna. The antenna system uses an antenna impedance matching circuit according to the above-described antenna to obtain a superior antenna radiation efficiency compared to current technologies, as shown in FIG. 3.

Second Embodiment

In a practical application, the aforementioned antenna impedance matching circuit and the feeder line and other components may be mounted on a printed circuit board (PCB). According to a third embodiment of this application, a printed circuit board is provided. The printed circuit board, that is, a bare board is prepared and used to mount the aforementioned antenna impedance matching circuit, as well as other antenna components. Since layout on the printed circuit board are repeatable and can have similarity, the design can be standardized to facilitate mechanization and automated production, and improve productivity, and can reduce errors in wiring and assembly. Printed circuit boards also have the advantage of being small and lightweight, which facilitates miniaturization of electronic devices, and are especially suitable for small mobile devices.

Figure 4:
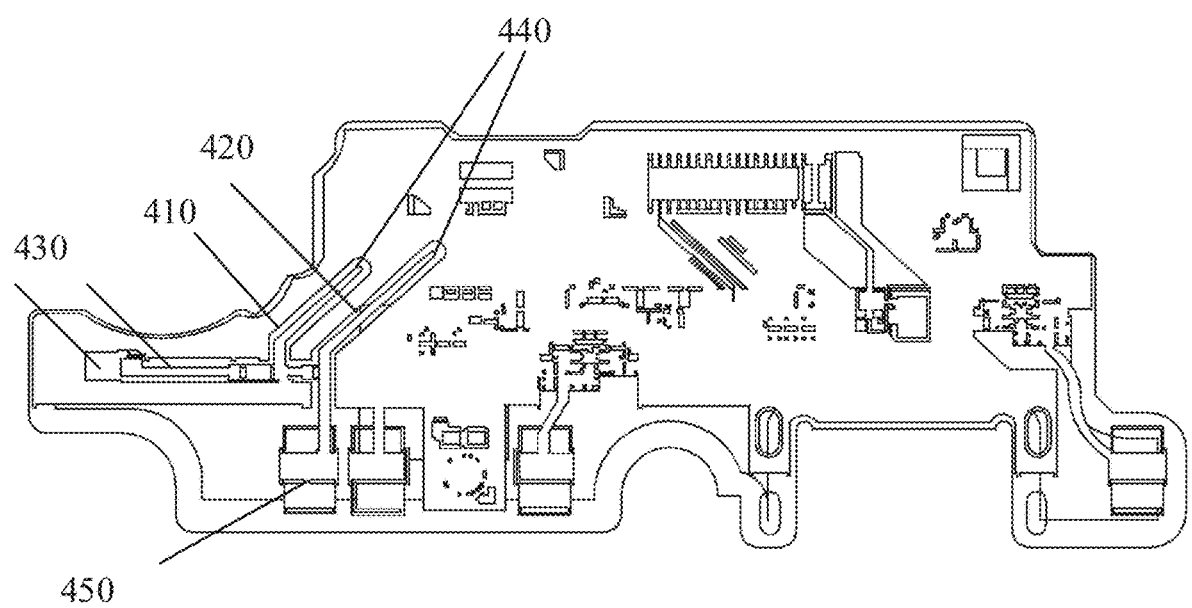
FIG. 4 illustrates a schematic diagram of a printed circuit board according to a third embodiment of the present application.

FIG. 4 is a schematic diagram of the printed circuit board. As shown in FIG. 4, the printed circuit board includes: a first line 410 for holding a first transmission line 210 in the antenna impedance matching circuit, and a second line 420 for holding a second transmission line 220 in the antenna impedance matching circuit. In particular, both the first line 410 and the second line 420 are connected in parallel with a line 430 holding the antenna feeder line, so that the first line 410 and the second line 420 are also connected in parallel with each other. As a consequence, the first transmission line and the second transmission line to be installed on the first line 410 and the second line 420 are connected in parallel with each other.

Figure 5:
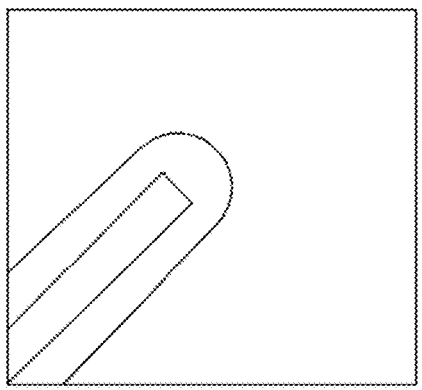
FIG. 5 illustrates a schematic diagram showing configuration of circuit terminals of the printed circuit board according to the third embodiment of the present application.
Figure 5:
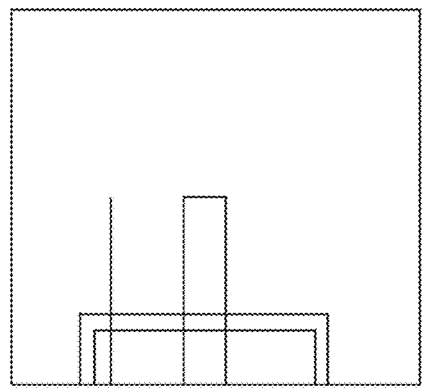

FIG. 5 shows settings of terminals 440 of the first line 410 and the second line 420 of the printed circuit board. As shown in a left figure of FIG. 5, the lines on the printed circuit board may be configured with terminals capable of enclosing the first transmission line, such that the transmission line is open after being mounted on the printed circuit board. As shown in a right figure of FIG. 5, the line on the printed circuit board may also be set open, so that the transmission line can be connected to the ground (GND) and thus shorted after being installed on the printed circuit board.

Figure 6:
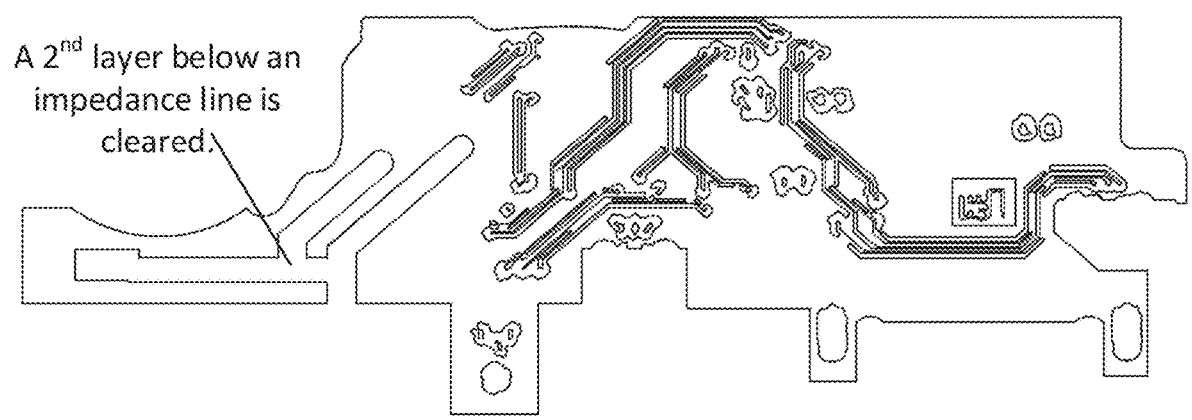
FIG. 6 is a schematic illustration of a second layer of the printed circuit board according to the third embodiment of the present application.

In an alternative embodiment, as shown in FIG. 6, a portion of a second layer of the printed circuit board below the first line 410 and the second line 420 is hollowed. The hollow arrangement has an advantage of easily achieving impedance matching between the first transmission line 210 installed in the first line 410 and the second transmission line 220 installed in the second line 420, which matches with the feeder line, as described above.

In an alternative embodiment, a distance between the first line 410 and the second line 420 and the ground is 0.1-0.2 mm, and may have a specific value set to, for example, 0.2 mm.

In an alternative embodiment, the distance between the first line 410 and the second line 420 and a location 450 of the antenna latch on the printed circuit board is less than 5 mm to facilitate coupling/connection between the antenna impedance matching circuit and the antenna after the antenna impedance matching circuit is mounted on the printed circuit board.

The circuit requires less space and is easy to be formed on the printed circuit board, which facilitates layout of other components on the printed circuit board and makes the printed circuit board more suitable for mobile terminals such as smartphones. The printed circuit board can be made of well known materials such as FR-4 fiberglass cloth or metal-based copper-clad laminate (CCL), and can be prepared by a person with ordinary skills in the art by selecting appropriate materials and production methods according to applications.

Third Embodiment

The printed circuit board according to the second embodiment may be equipped with antenna-related components and antenna impedance matching circuit according to the first embodiment. Thus, a third embodiment of the present application provides a circuit board comprising an antenna impedance matching circuit according to the first embodiment and a printed circuit board according to the second embodiment.

In other words, the present embodiment provides a circuit board on which antenna-related components are mounted. Unlike a conventional circuit board, the circuit board employs a different antenna impedance matching circuit, and the printed circuit board has a different layout, thereby allowing the antenna system employing the circuit board to obtain a better transceiver efficiency. The effect of which can be seen in FIG. 3.

Fourth Embodiment

The aforementioned circuit board may be connected to the antenna by an antenna latch. Thus, a fourth embodiment of the present application may provide an antenna system comprising a circuit board and antenna elements according to the third embodiment.

Figure 7:
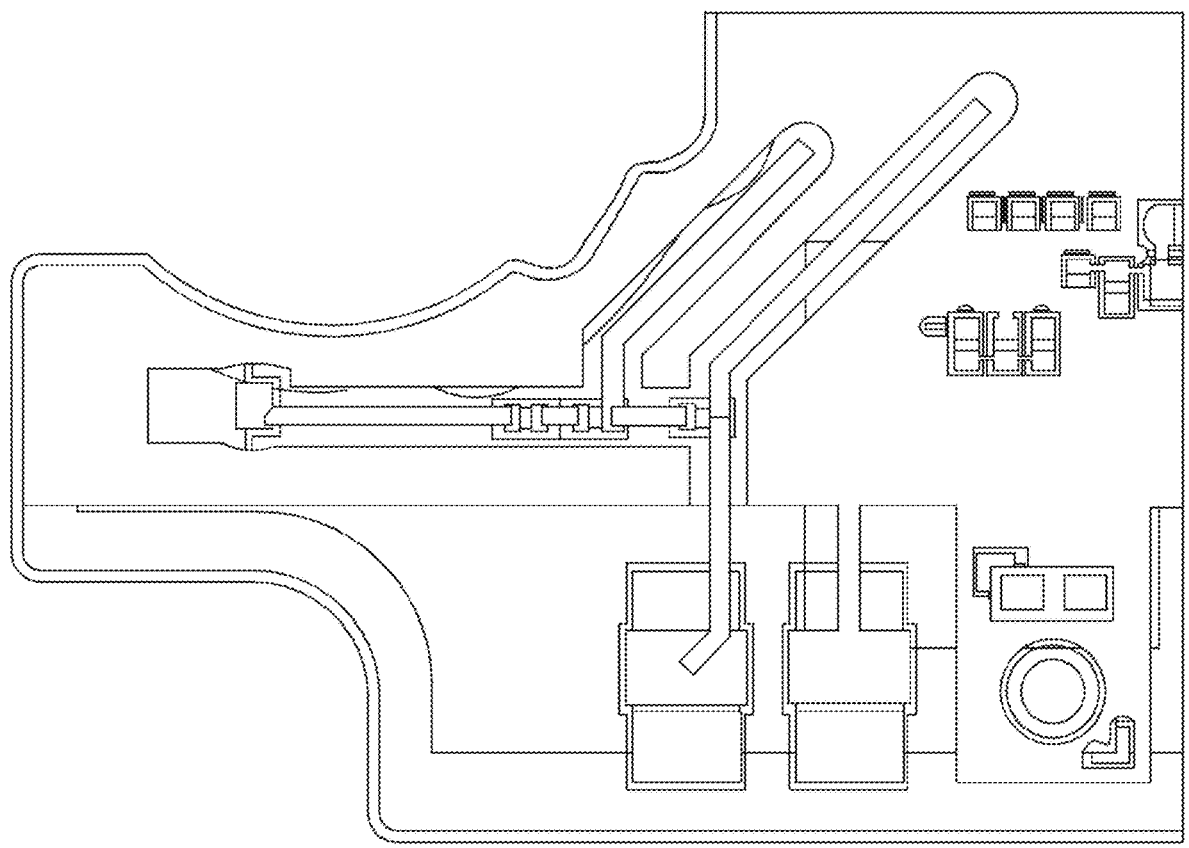
FIG. 7 is a schematic illustration of an antenna system according to the present embodiment.

FIG. 7 shows a schematic diagram of an antenna system according to the present embodiment. As shown in FIG. 7, a first transmission line and a second transmission line are respectively mounted in the first line and second line, and are connected in parallel with a nearby feeder line. The antenna latch is mounted at an end of the transmission lines and the antenna latch is connected to the antenna.

In operation, the feeder line transmits signal power from the transmitter with minimal loss to the input of the transmitting antenna, which is radiated by the antenna in the form of an electromagnetic wave. Since the antenna impedance matching circuit in this application utilizes a transmission line of a specific length to replace the chip capacitors and inductors in the conventional technology, higher antenna efficiency can be obtained, as shown in FIG. 3.

Fifth Embodiment

The aforementioned antenna system may be assembled into a mobile terminal to provide an antenna signal transceiver function for the mobile terminal. Thus, a fifth embodiment of the present application may provide a mobile terminal, which includes an antenna system according to the fourth embodiment.

Figure 8:
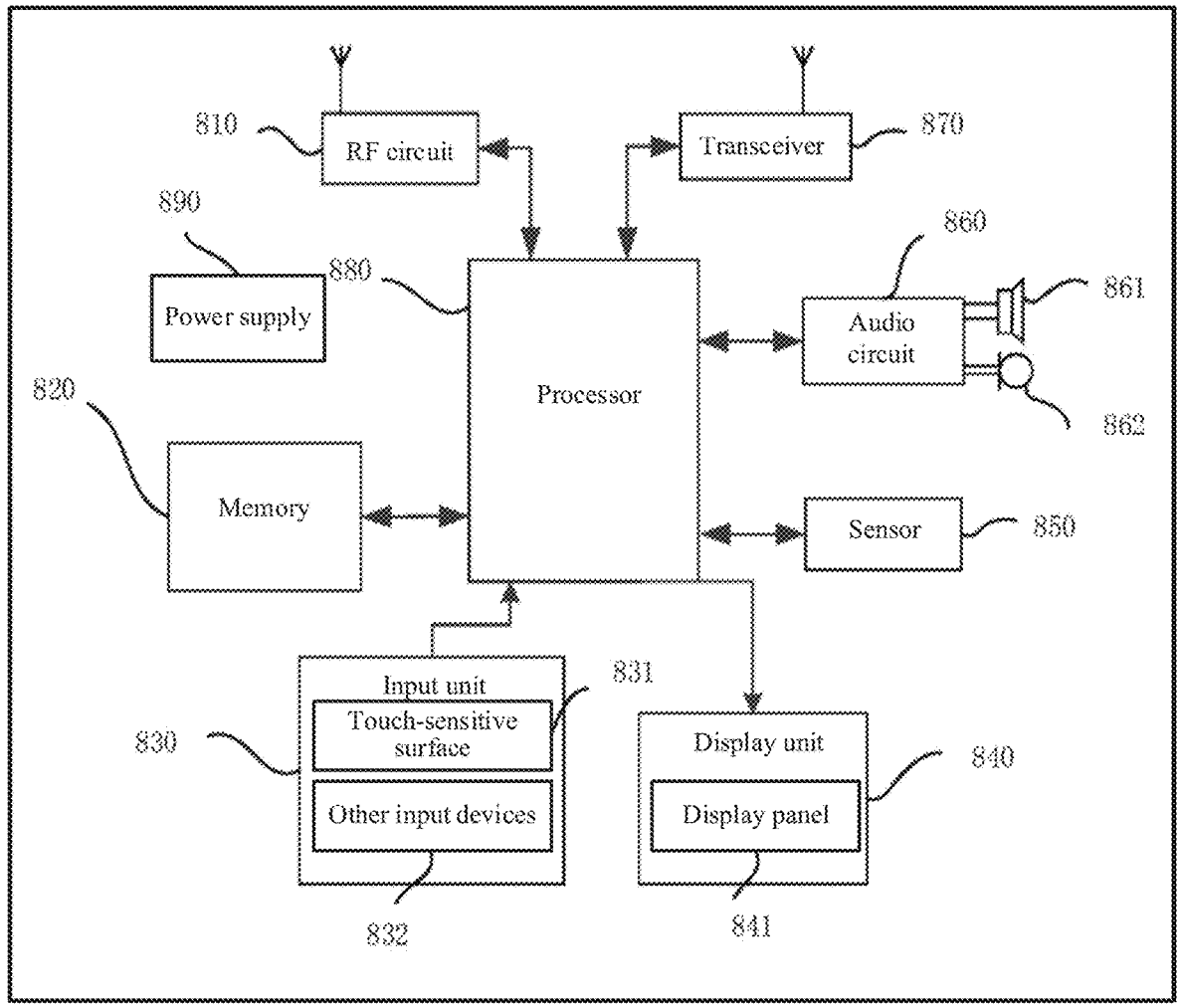
FIG. 8 is a schematic diagram showing a structure of a mobile terminal according to an embodiment of the present application.

FIG. 8 shows a schematic diagram of a structure of the mobile terminal according to the embodiment of the present application. The mobile terminal comprises an antenna system according to the above embodiment. The mobile terminal may be one of the following: a mobile phone, a tablet, a laptop, a smart watch, a smart bracelet, or a smart wearable device. Taking a mobile phone, such as a cell phone, as an example, a block diagram of a portion of the structure is shown in FIG. 8.

The cell phone includes a radio frequency (RF) circuit 810, a memory 820, an input unit 830, a display unit 840, a sensor 850, an audio circuit 860, a wireless module 870, a processor 880, and a power supply (PS) 890, among other parts. As appreciated by those of ordinary skills in the art, the structure of the cell phone shown in FIG. 8 does not constitute a limitation of the cell phone and may include more or fewer parts than what is shown in the figure, a combination of certain parts, or a different arrangement of parts.

The RF circuit 810 is used to receive and transmit electromagnetic waves and to perform conversion between electromagnetic waves and electrical signals for communication with a communication network or other devices. The RF circuit 810 may include various current circuit components used to perform these functions, such as antennas, radio frequency transceivers, digital signal processors (DSP), encryption/decryption chips, subscriber identity module (SIM) cards, memory, and others. The RF circuit 810 may communicate with various networks such as the Internet, corporate intranets, wireless networks, or with other devices via wireless networks. The wireless network described above may include a cellular telephone network, a wireless local area network, or a metropolitan area network. The wireless network described above may use various communication standards, protocols, and technologies, including, but not limited to, the Global System for Mobile Communication (GSM), Enhanced Data GSM Environment (EDGE), Wideband Code Division Multiple Access (WCDMA), Code Division Multiple Access (CDMA), Time Division Multiple Access (TDMA), Wireless Fidelity (WI-FI), such as IEEE standards IEEE 802.11a, IEEE 802.11b, IEEE 802.11g and/or IEEE 802.11n, Voice over Internet Protocol (VoIP), Worldwide Interoperability for Microwave Access (WI-MAX), other protocols for email, instant messaging, and short message services (SMS), and any other suitable communication protocols which may even include those that are not yet developed.

The memory 820 may be used to store software programs and modules. The processor 880 performs various functional applications and data processing by running the software programs and modules stored in the memory 820. The memory 820 may include high-speed random access memory, and may also include non-volatile memory, such as one or more magnetic storage devices, flash memory, or other non-volatile solid state memory. In some examples, the memory 820 may further include memory set up remotely with respect to the processor 880, and these remote memories may be connected to a mobile terminal via a network. Examples of the above networks include, but are not limited to, the Internet, corporate intranets, local area networks, mobile communication networks, and combinations thereof.

The input unit 830 may be used to receive input numeric or character information and to generate user settings and function control input signals related to a keyboard, a mouse, a joystick, optical, or a trackball. Specifically, the input unit 830 may include a touch-sensitive surface 831 and other input devices 832. The touch-sensitive surface 831, also referred to as a touch display or touchpad, may collect user touch operations on or near the touch-sensitive surface 831, such as user operations on or near the touch-sensitive surface 831 using any suitable object or accessory such as a finger or a stylus, and drive an associated connected device according to a predetermined program. Alternatively, the touch-sensitive surface 831 may include two parts, a touch detection device and a touch controller. In particular, the touch detection device detects the user's touch orientation and detects signals generated from the touch operations and sends the signals to the touch controller. The touch controller receives information of the touch operations from the touch detection device, converts the received information into contact coordinates, and then sends the contact coordinates to the processor 880, and can receive and execute commands sent by the processor 880. Additionally, a variety of types of resistive, capacitive, infrared, and surface acoustic wave touch pad may be used to implement the touch-sensitive surface 831. In addition to the touch-sensitive surface 831, the input unit 830 may also include other input devices 832. Specifically, the other input devices 832 may include one or more of, but are not limited to, a physical keyboard, function keys, such as volume control buttons and switch buttons, trackballs, mice, joysticks.

The display unit 840 may be used to display information entered by a user and provide information and various graphical user interfaces (GUIs) of the mobile terminal to a user. The GUIs may be composed of graphics, text, icons, video, and any combination thereof. The display unit 840 may include a display panel 841, which may optionally be configured in the form of a liquid crystal display (LCD), or an organic light-emitting diode (OLED) display. Furthermore, the touch-sensitive surface 831 may cover the display panel 841. When detecting a touch operation on or near the touch-sensitive surface 831, the touch-sensitive surface 831 transmits the touch operation to the processor 880 to determine a type of touch event. The processor 880 subsequently provides a corresponding visual output on the display panel 841 based on the type of touch event. Although in FIG. 8, the touch-sensitive surface 831 and the display panel 841 are implemented as two separate components for input and output functions, in some embodiments, the touch-sensitive surface 831 can be integrated with the display panel 841 to implement the input and output functions.

The mobile terminal may also include at least one sensor 850, such as a light sensor, a motion sensor, and other sensors. Specifically, the light sensor may include an ambient light sensor and a proximity sensor. In particular, the ambient light sensor may adjust brightness of the display panel 841 based on brightness of ambient light, and the proximity sensor may turn off the display panel 841 and/or the backlight when the mobile terminal is moved to an ear. As a type of motion sensor, a gravity acceleration sensor can detect magnitude of acceleration in each direction, generally of three axes, and the magnitude and direction of gravity when stationary, and can be used for applications for recognizing mobile phone orientations, such as horizontal and vertical screen switching, related games, magnetometer calibration, vibration recognition related functions, such as a pedometer or tapping. As for other sensors that can also be configured in the mobile terminal, such as gyroscopes, barometers, hygrometers, thermometers, and infrared sensors, detail description will not be detailed here.

The audio circuit 860, the speaker 861, and the microphone 862 may provide an audio interface between the user and the mobile terminal. The audio circuit 860 may transmit to the speaker 861 the electrical signals which is converted from the received audio data. The speaker 861 converts the electrical signals into sound signals for output. On the other hand, the microphone 862 collects and converts sound signals into electrical signals, which is received by the audio circuit 860 and converted into audio data, which is then output to the processor 880 and processed by the RF circuit 810 to send to, for example, another a terminal, or output to the memory 820 for further processing. The audio circuit 860 may further include an earbud jack to provide communication between a peripheral headset and a mobile terminal.

The mobile terminal may assist the user in sending and receiving e-mail, browsing webpages, and accessing streaming media via a transmission module 870, such as a WI-FI module, which provides wireless broadband Internet access to the user. Although the transmission module 870 is shown in FIG. 8, it can be understood that the transmission module 870 is not a necessary component of the mobile terminal and can be omitted entirely as needed without altering the principles of the invention.

The processor 880 is a control center for the mobile device, utilizes various interfaces and wiring to connect various parts of the entire mobile phone to perform various functions of the mobile device and process data by running or executing software programs and/or modules stored in the memory 820, as well as using data stored in the memory 820, thereby providing overall monitoring of the mobile phone. Alternatively, the processor 880 may include one or more processing cores. In some embodiments, the processor 880 may integrate an application processor and a modem processor. In particular, the application processor primarily handles operating systems, user interfaces, and applications, and the modem processor primarily handles wireless communications. Note that the modem processor may also not be integrated into the processor 880.

The mobile terminal also includes a power supply 890, such as a battery, that supplies power to various components. In some embodiments, the power supply may be connected to the processor 880 logic via a power management system, thereby enabling functions such as managing charging, discharging, and power consumption management via the power management system. The power supply 890 may also include one or more direct current (DC) or alternating current (AC) power supplies, a re-charging system, a power fault detection circuit, a power converter or inverter, a power status indicator, and any other components.

Although not shown, the mobile terminal may also include a camera, such as a front camera or a rear camera, a Bluetooth module, and others, which are not be detailed herein. Specifically, in the present embodiment, the display of the mobile terminal is a touch display, and the mobile terminal also includes a memory.

In the above description of specific embodiments of the present application, the features described and/or illustrated for one embodiment may be used in the same or similar manner in one or more other embodiments, in combination with features in other embodiments, or in place of features in other embodiments.

It should be emphasized that the term "includes/contains", when used herein, refers to the presence of a feature, element, step or component, but does not exclude presence or addition of one or more other features, elements, steps or components. The terms "first", "second", and the similar, which refer to sequential numbers, do not indicate the order or degree of importance in which the feature, element, step or component is to be implemented as defined by these terms, but are used only for marking these features, elements, steps or components for descriptive clarity in the context.

Although embodiments of the present application are described in conjunction with the drawings, those of ordinary skills in the art may make various modifications and variations without departing from the principles and scope of the present application, and such modifications and variations fall within the scope limited by the appended claims.

What is claimed is:

1. An antenna impedance matching circuit comprising:
a first transmission line, wherein the first transmission line having a first specific length that makes the first transmission line capacitive; and
a second transmission line, wherein the second transmission line having a second specific length that makes the second transmission line inductive;
wherein the first transmission line and the second transmission line are connected in parallel and wherein terminals of the first transmission line and the second transmission line are open or shorted;
the antenna impedance matching circuit comprises:
a first line connected in parallel with a line containing an antenna feeder line, for holding the first transmission line having the first specific length; and
a second line connected in parallel with the line containing the antenna feeder line, for holding the second transmission line having the second specific length;
wherein a terminal of the first line is configured to enclose the terminal of the first transmission line to unground the first transmission line, or is configured to be open to ground the first transmission line, and a terminal of the second line is configured to enclose the terminal of the second transmission line to unground the second transmission line, or is configured to be open to ground the second transmission line.

2. The antenna impedance matching circuit according to claim 1, wherein
both the first transmission line and the second transmission line have a width of 0.2-0.3 mm.

3. The antenna impedance matching circuit according to claim 1, wherein impedance of the first transmission line and the second transmission line are both 50 ohms.

4. The antenna impedance matching circuit according to claim 1, wherein
the antenna impedance matching circuit is mounted on a printed circuit board, and a second layer of the printed circuit board is partially clear below the first line and the second line.

5. The antenna impedance matching circuit according to claim 1, wherein
the first line and the second line are at a distance of 0.1-0.2 mm from ground.

6. The antenna impedance matching circuit according to claim 1, wherein
the antenna impedance matching circuit is mounted on a printed circuit board, and a distance between the first and second lines and a location of an antenna latch on the printed circuit board is less than 5 mm.

7. An antenna system comprising
an antenna and a circuit board, wherein the circuit board comprises a printed circuit board and an antenna impedance matching circuit, wherein the antenna impedance matching circuit is mounted on the printed circuit board, the printed circuit board is applied to an antenna system comprising an antenna and the antenna impedance matching circuit;
wherein the antenna impedance matching circuit comprises: a first transmission line having a first specific length that makes the first transmission line capacitive, and a second transmission line having a second specific length that makes the second transmission line inductive, wherein the first transmission line and the second transmission line are connected in parallel, and terminals of the first transmission line and the second transmission line are open or shorted;
the printed circuit board comprises: a first line connected in parallel with a line containing an antenna feeder line, for holding the first transmission line having the first specific length, and a second line connected in parallel with the line containing the antenna feeder line, for holding the second transmission line having the second specific length;
wherein a terminal of the first line is configured to enclose the terminal of the first transmission line to unground the first transmission line, or is configured to be open to ground the first transmission line, and a terminal of the second line is configured to enclose the terminal of the second transmission line to unground the second transmission line, or is configured to be open to ground the second transmission line.

8. The printed circuit board according to claim 7, wherein a second layer of the printed circuit board is partially clear below the first line and the second line.

9. The printed circuit board according to claim 7, wherein the first line and the second line are at a distance of 0.1-0.2 mm from ground.

10. The printed circuit board according to claim 7, wherein
a distance between the first and second lines and a location of an antenna latch on the printed circuit board is less than 5 mm.

11. The printed circuit board according to claim 7, wherein
the first and second transmission lines are both 0.2-0.3 mm wide.

12. The printed circuit board according to claim 7, wherein
both the first transmission line and the second transmission line have an impedance of 50 ohms.

13. A mobile terminal comprising
an antenna system, wherein the antenna system comprises an antenna and a circuit board, the circuit board comprises a printed circuit board and an antenna impedance matching circuit, the antenna impedance matching circuit is mounted on the printed circuit board;
wherein the antenna impedance matching circuit comprises: a first transmission line having a first specific length that makes the first transmission line capacitive, and a second transmission line having a second specific length that makes the second transmission line inductive, wherein the first transmission line and the second transmission line are connected in parallel, and terminals of the first transmission line and the second transmission line are open or shorted;
the printed circuit board comprises: a first line connected in parallel with a line containing an antenna feeder line, for holding the first transmission line having the first specific length, and a second line connected in parallel with the line containing the antenna feeder line, for holding the second transmission line having the second specific length;

wherein a terminal of the first line is configured to enclose the terminal of the first transmission line to unground the first transmission line, or is configured to be open to ground the first transmission line, and a terminal of the second line is configured to enclose the terminal of the second transmission line to unground the second transmission line, or is configured to be open to ground the second transmission line.

14. The mobile device according to claim 13, wherein the mobile device is one of the following: a mobile phone, a tablet, a laptop, a smart watch, a smart bracelet, or a smart wearable device.

15. The mobile terminal according to claim 13, wherein a second layer of the printed circuit board is partially clear below the first line and the second line.

16. The mobile terminal according to claim 13, wherein the first line and the second line are at a distance of 0.1-0.2 mm from ground.

17. The mobile terminal according to claim 13, wherein a distance between the first and second lines and a location of an antenna latch on the printed circuit board is less than 5 mm.

18. The mobile terminal according to claim 13, wherein the first and second transmission lines are both 0.2-0.3 mm wide.

19. The mobile terminal according to claim 13, wherein both the first transmission line and the second transmission line have an impedance of 50 ohms.

* * * * *